United States Patent [19]

Vu et al.

[11] Patent Number: 4,845,681

[45] Date of Patent: Jul. 4, 1989

[54] GAAS SCFL RAM

[75] Inventors: Tho T. Vu, Fridley; Andrzej Peczalski, Brooklyn Park; James D. Joseph, Oakdale, all of Minn.

[73] Assignee: Honeywell Inc., Minneapolis, Minn.

[21] Appl. No.: 103,777

[22] Filed: Oct. 2, 1987

[51] Int. Cl.$^4$ .................... G11C 8/00; G11C 11/34; H03K 19/094; H03F 3/45

[52] U.S. Cl. .................... 365/230.08; 365/189.05; 365/177; 365/175; 307/530; 307/450

[58] Field of Search ............... 365/230, 177, 229, 189, 365/230.08, 154, 174, 175, 189.05; 357/43; 307/450, 530

[56] References Cited

U.S. PATENT DOCUMENTS

| | | | |
|---|---|---|---|
| 4,438,351 | 3/1984 | Scheurmeyer | 307/450 |
| 4,518,871 | 3/1985 | Toyoda et al. | 307/443 |
| 4,532,439 | 7/1985 | Koike | 307/450 |
| 4,558,235 | 12/1985 | White et al. | 307/450 |
| 4,568,957 | 2/1986 | Zuleeg et al. | 357/22 |
| 4,575,821 | 3/1986 | Eden et al. | 365/175 |
| 4,665,508 | 5/1987 | Chang | 365/208 |
| 4,728,803 | 3/1988 | Catchpole et al. | 358/213.15 |
| 4,771,194 | 9/1988 | Van Zeghbroeck | 365/205 |

OTHER PUBLICATIONS

"GaAs Enhancement/Depletion MESFET Memory Technology", McLevige et al., 1982, IEEE GaAs IC Symposium, pp. 127–130.

"GaAs MSI with JFET DCFL", Kato et al., 1983 IEEE, GaAs IC Symposium, pp. 182–185.

"Advanced GaAs DCFL Constructions with 8×8 Bit Parallel Multipliers", Kawakami et al., 1984 IEEE, pp. 107–110.

"A Radiation-Hard Low Power GaAs Static Ram Using E-JFET DCFL" Troeger et al., 1983 IEEE GaAs IC Symposium.

"A Low Power/Static GaAs MESFET Logic Gate," Namordi et al., IEEE 1982 GaAs IC Symposium, pp. 21–24.

"An LSI GaAs DCFL Using Self-Aligned MESFET Technology", Nakayama et al., 1982 IEEE Symposium GaAs IC Symposium, pp. 6–9.

"Improved Logic Gate with a Push-Pull Output", Helix et al., 1982 IEEE GaAs IC Symposium, pp. 109–111.

"GaAs IKB Static RAM with E/DMESFET DCFL", Ino et al., 1982 IEEE GaAs IC Symposium, pp. 2–5.

"A 256×4 Bit GaAs Static RAM", Toyoda et al., 1983 IEEE GaAs IC Symposium, pp. 86–89.

"GaAs 16K SRAM" Honeywell Property Proposal, pp. 1–92.

"GaAs IGFET: a New Device for High Speed Digital IC's," Schuermeyer et al., International Electron Devices Meeting, 12/80, pp. 441–444.

"A GaAs Chip Set for Multiplex: Demultiplex Applications . . .", Flahive et al., IEEE GaAs IC Symposium, 1984, pp. 7–10.

"A GaAs Monolithic Frequency Divider Using Source Coupled FET Logic" S. Katsu, et al., IEEE Electron Device Letters, vol. EDL-3, No. 8, Aug. 1982, pp. 197–199.

"A 320 Gate GaAs Logic Gate Array" D. Kinell, 1982 IEEE GaAs Symposium, pp. 17–20.

Primary Examiner—Stuart N. Hecker
Assistant Examiner—Melissa J. Koval
Attorney, Agent, or Firm—John G. Shudy, Jr.

[57] ABSTRACT

A GaAs SCFL RAM having a unique three-voltage-level write circuit, direct-read circuitry with only one gate delay, diode-coupled FET logic cells, and peripheral circuitry with SCFL gates. The memory module architecture and plan of the RAM allow for several design options which may include 1K×16 and 16K×1 memory configurations. The RAM incorporates strobe circuitry for powering down selected memory modules, without loss of data, thus reducing power dissipation. The SCFL circuitry of the RAM functions with closely matched complementary signals for fast switching with minimum current spiking. The RAM has a wide range of threshold voltage tolerance, excellent noise margin, and a very high level of radioactive radiation hardness.

8 Claims, 7 Drawing Sheets

GAAS SCFL RAM

FIELD OF THE INVENTION

The present invention pertains to gallium arsenide (GaAs) semiconductor technology and particularly to GaAs random access memories (RAM's). More particularly, the invention pertains to GaAs source coupled field effect transistor logic (SCFL) RAM's.

RELATED ART

Elementary development of GaAs RAM's has been achieved in the art. However, none is known to include the novel features of the present invention.

SUMMARY OF INVENTION

The present invention is an SCFL RAM design having the advantages of a wider range of threshold voltage tolerance and more reliable memory operation than existing related art GaAs memories. The peripheral circuitry is implemented with SCFL gates. SCFL has an excellent noise margin and excellent speed/power performance. Manufacturability of GaAs SCFL is very good because the performance of the circuitry is not sensitive to threshold voltage variations. SCFL temperature variations are small. Bus line noise is reduced as current remains virtually constant. The SCFL GaAs memory exhibits a very high level of radioactive radiation hardness.

One feature of the invention is the direct-read circuitry which reduces the conventional two-to-three-gate delay, typical of a data buffer, to one. Another feature is a unique three-level-write circuit which allows high-speed writing of data to both high and lower states of voltage from a third, standby level. These features are particularly incorporated in the diode coupled FET logic (DCFL) memory cells and the SCFL OR/NOR gates of the invention. The DCFL cells result in reduced chip area and access time compared to conventional memory cells. SCFL OR/NOR gates reduce time delays on read and write lines in contrast to related art lines. The application of the above-mentioned features to GaAs technology in the related art is not known to the present applicants. These features are utilized in combination with a new application of bipolar Si techniques to GaAs FET technology.

Another feature is that the architecture and floor plan of the 16K RAM embodiment allow several design options which include 1K×16 and 16K×1 memory configurations using one set of underlayers through different metal masks. This the first time such an option design has been effected in GaAs memories. Such architecture and floor plan allowing for an optimal format are applicable to any memory size, i.e., 16K, 64K, 256K, etc.

The 16K×1 memory utilizes an on-the-chip multiplexer which takes only one gate delay to merge the 16 data lines into one.

The architecture allows for the powering down of any of the 16×1K memory modules. This powering down reduces power dissipation.

The smaller 1K blocks of memory reduce interconnect length per signal line, further utilizing the inherent high speed capabilities of GaAs.

The SCFL circuitry of the RAM is designed to provide closely-matched complementary signals. These signals can be used to drive push-pull FETs with minimum current spiking. This circuitry results in faster switching speeds and much lower power dissipation than open-source circuitry because the outputs are actively pulled up and down during switching transitions without reliance on resistor-capacitor time constants.

DESCRIPTION OF THE PREFERRED EMBODIMENT

Figure 1:
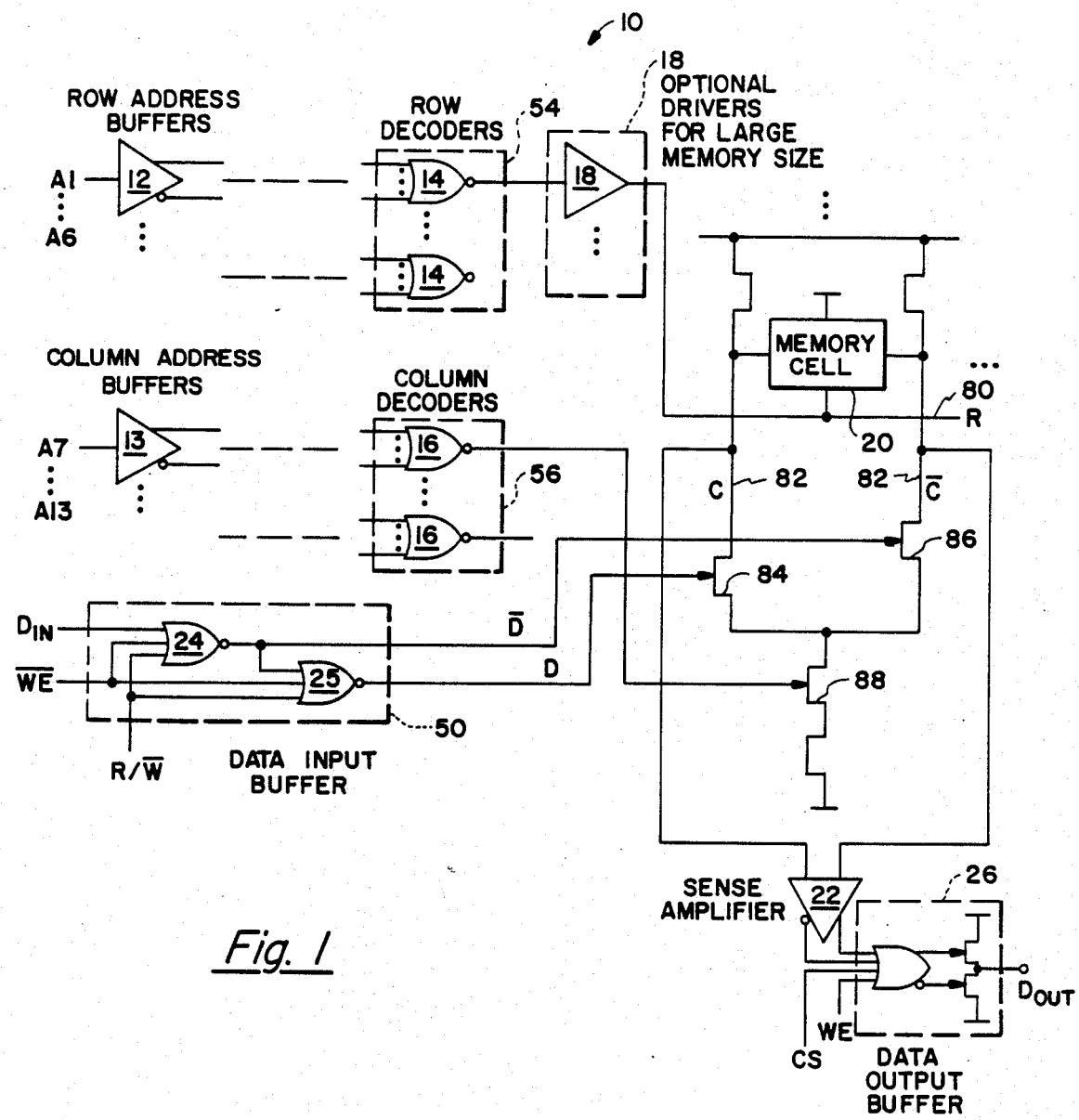
FIG. 1 displays the basic components of an SCFL RAM.

FIG. 1 shows the approach of using basic circuit components to implement SCFL RAM 10. These components include address buffers 12 and 13, row decoders 14, column decoders 16, drivers 18, memory cells 20, sense amplifier 22, data input buffers 24 and 25, and output buffers 26.

Figure 6:
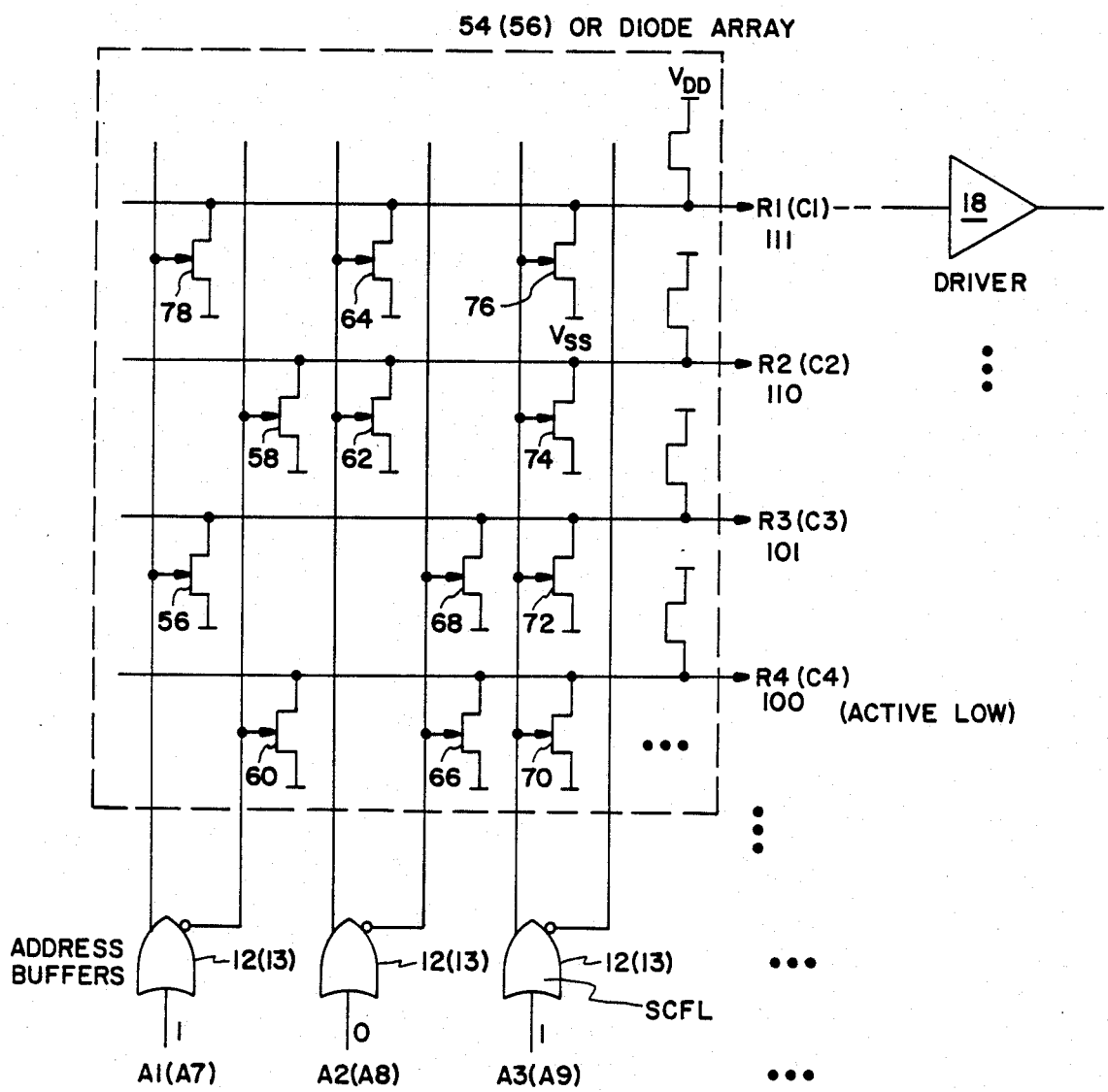
FIG. 6 is a schematic of the representative portion of the row and column decoder.

In FIG. 1, address signals A1 through A6 provide an address to a set of address buffers 12 which output signals in a complementary pairs. Signals A7 through A13 compose the column portion of the address. These signals are fed into address buffers 13 which output signals in complementary pairs. The complementary outputs of address buffers 12 are fed into row decoders 14. Each of the row decoders 14, one of which is uniquely selected for a single address input combination, exhibits an output upon selection. The output may be optionally buffered with driver 18. Driver 18 would be used for a large memory size (i.e., greater than 4K bits). Row decoders 14 compose together circuit 54 as shown in FIG. 6. FIG. 6 shows the address buffers which are SCFL circuitry known in the art. Also shown in FIG. 6 is row decoders array 54 which demonstrates the use of FET logic gates connected in a particular pattern such that a particular address input to address buffers may result in the selection of one row according to the arrangement of the FETs in row decoders array 54. Optional driver 18 is also illustrated. Array 54 is designed for the selection of one of four rows. For example, if the address is such that A1 is a logic 1, A2 is a logic 1 and A3 is a logic 1, then the selection will be row one (R1) which has its address in binary logic listed below it as "111". For another example, if the address input is A1 equal to a logic 1, A2 equal to a logic 0 and A3 equal to a logic 1, then the row selected would be row three R3 with the address 101 indicated under (R3) in FIG. 3. The FETs are either enhancement or depletion mode junction MESFETs.

The buffered complementary address signals from address buffers 13 are input to column decoders 16 which form array 56. Each address selects a particular column. The circuitry for column decoders array 56 is the same as that for row decoders array 54. The designations in FIG. 6 for column address buffers 13 and column decoders array 56 are noted in parentheses. The columns are indicated as C1, C2, C3 and C4 within parentheses in FIG. 6. The operation of array 56 is the same as array 54. Diodes can be used instead of FETs in these row and column decoders which result in higher compactness on a chip. Row decoders array 54 and column decoders array 56 select row 80 and column 82, respectively, for selecting memory cell 20 for reasons of writing or reading data. Cell 20 is cross-coupled FETs which reflect one state or another in response to a signal from column C to diode 36 or a signal from column $\overline{C}$ through diode 38.

Figure 2A:
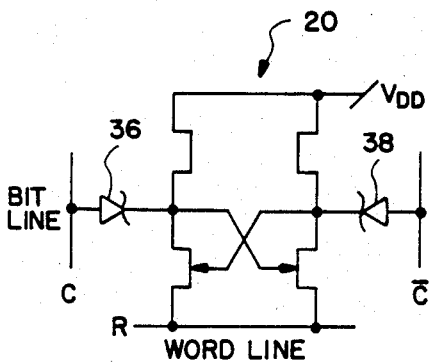
FIG. 2a illustrates the diode-coupled memory cell.
Figure 2B:
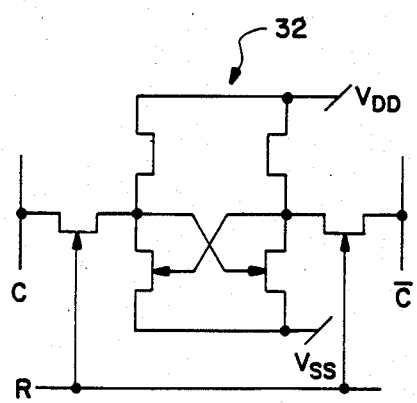
FIGS. 2b and 2c illustrate the related art transmission gate cell and source-coupled cell, respectively.
Figure 2C:
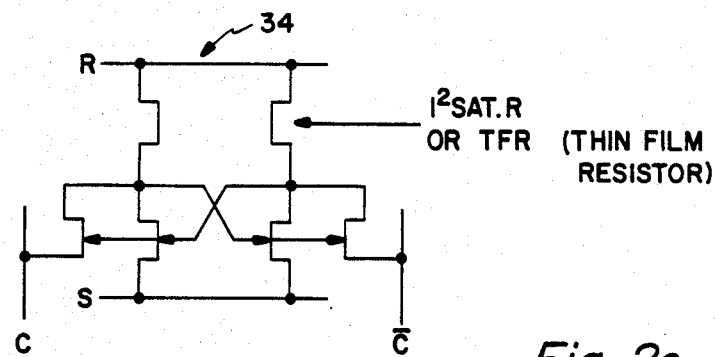

Diode coupled memory cell 20 is shown in FIG. 2a. Diode memory cell 20 is more advantageous than other memory cell designs such as transmission gate cell 32 of FIG. 2b and source coupled cell 34 of FIG. 2c. Diode coupled cell 20 has about a 25 percent smaller chip area than cell 32 or cell 34. Diode coupled cell 20 reduces about 30 percent the column line capacitance loading thereby resulting in a 30 percent faster access time in comparison to other cells 32 and 34. Access time is affected by how fast a memory cell can charge the bit-line capacitance. Operating signal to noise margins of diode coupled cell 20 are higher than other cells 32 and 34 because of the good isolation features of Schottky diodes 36 and 38 over transmission gates.

Figure 3:
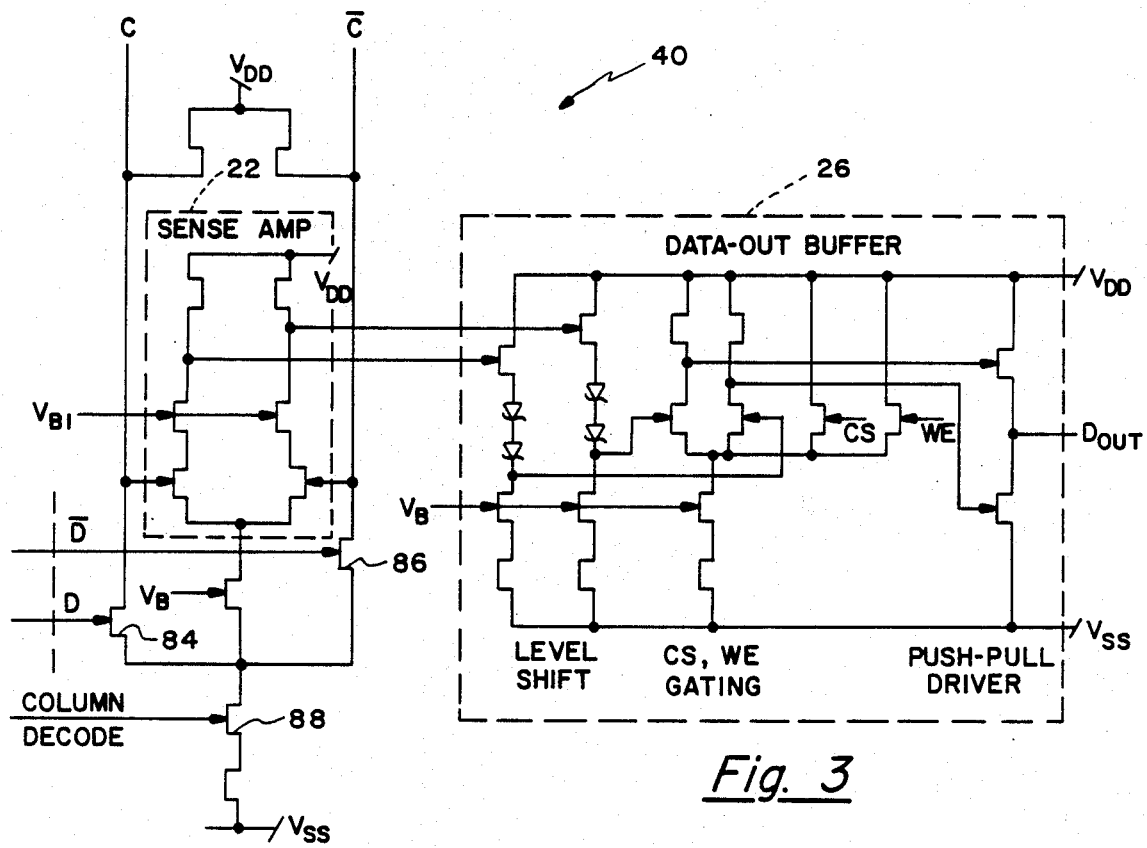
FIG. 3 is a schematic of the RAM read circuitry.

FIG. 3 is a schematic of read circuitry 40 of the invention. Read circuitry 40 uniquely incorporates SCFL. Circuitry 40 has large signal to noise margins and large tolerances to temperature variations. SCFL provides true and complement output signals which simplify implementations and eliminate clock skew problems.

The column information, i.e., bit lines, is connected to sense amplifier 22. The word lines are selected by the row decoders array 54. The complementary outputs of sense amplifier 22 go into data output buffer 26. FIG. 3 is a schematic of sense amplifier 22 and data output buffer 26. The data output buffer 26 also has CS and WE gating into inputs of the data output buffer. These inputs are OR-ed with complementary inputs. The complementary outputs of the OR gate are fed into a push-pull FET driver. The output signal consisting of and are read out of the memory.

Figure 4:
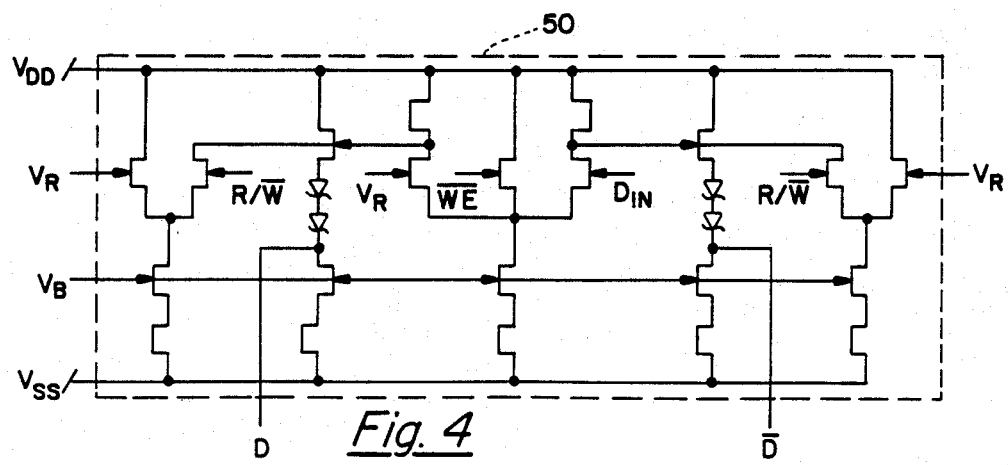
FIG. 4 is a schematic of three level write circuitry.
Figure 5:
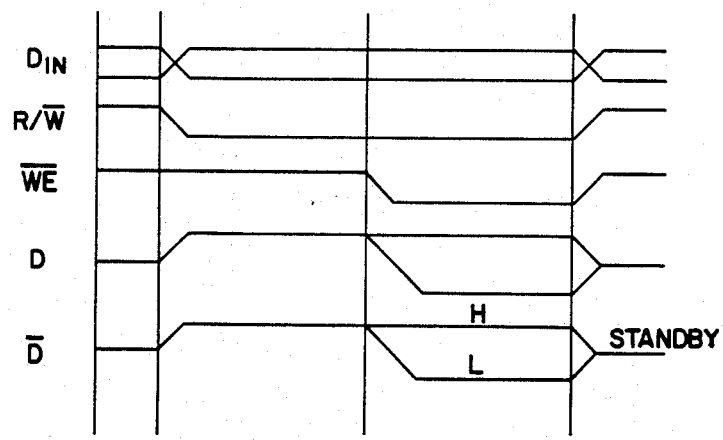
FIG. 5 is a diagram of the three level write circuitry voltage levels in relation to each other.

FIG. 4 is a schematic of a representative portion of write circuitry 50. Write circuitry 50 has three levels in that the data going into the column lines have high, low and standby levels. FIG. 5 is a diagram of the voltage levels for high, low and standby. Increased writing speeds are achieved with such levels because the required voltage swings on the data write lines from standby mode to a logic low or high are reduced by 50 percent.

Write circuitry 50 in FIGS. 1 and 4 is essentially a data input buffer which provides complementary data outputs D and $\overline{D}$ to FETs 84 and 86, respectively. Data-in is input into a circuit functioning as NOR gate 24 (in FIG. 1). $\overline{WE}$ into gate 24 and into a circuit functioning as a NOR gate 25. R/$\overline{W}$ is input to both circuits 24 and 25. Data $\overline{D}$ is output of circuit 24 into circuit 25 and to FET 86. The output data D from gate 25 goes only to FET 84.

FIG. 6 reveals circuitry for the row and column decoder utilizing a NOR logic approach implementing SCFL.

Figure 7:
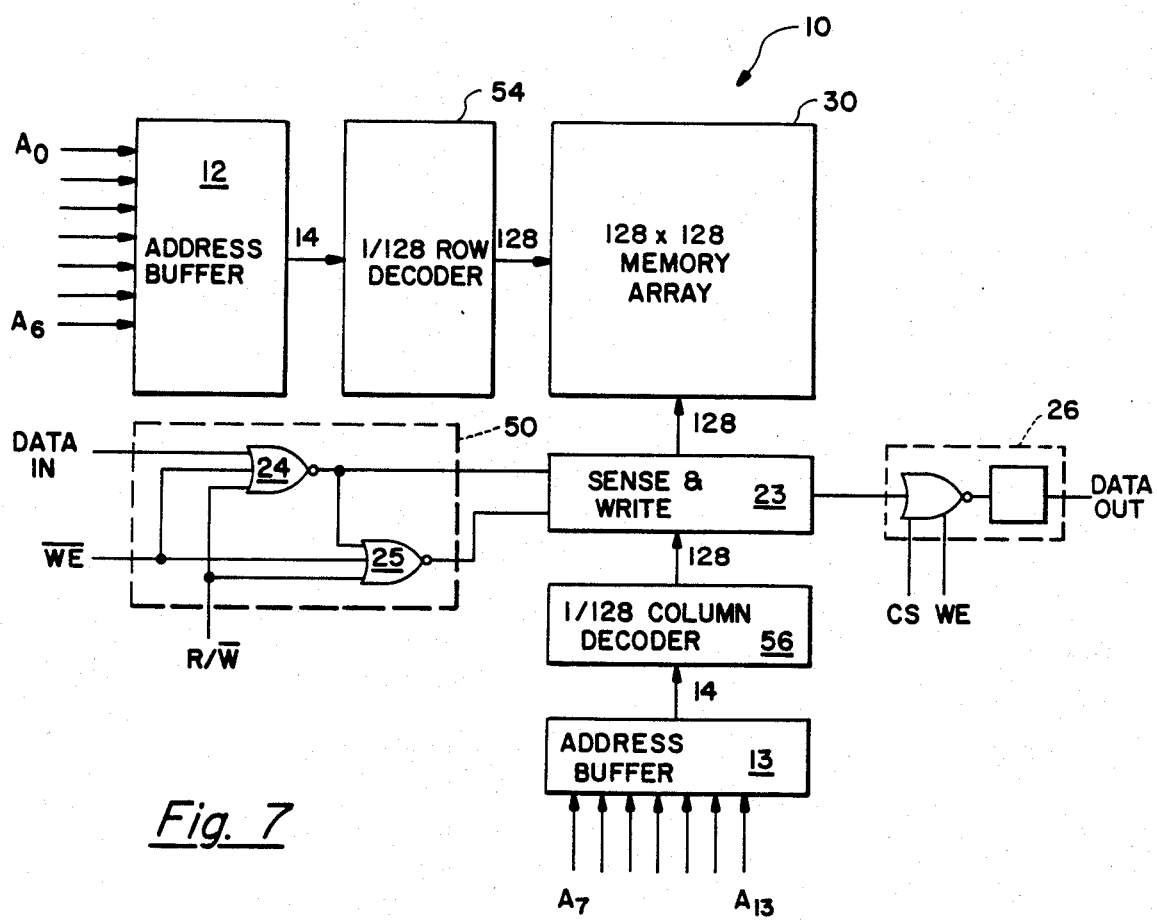
FIG. 7 shows the architecture of a 16K×1 RAM.
Figure 8:
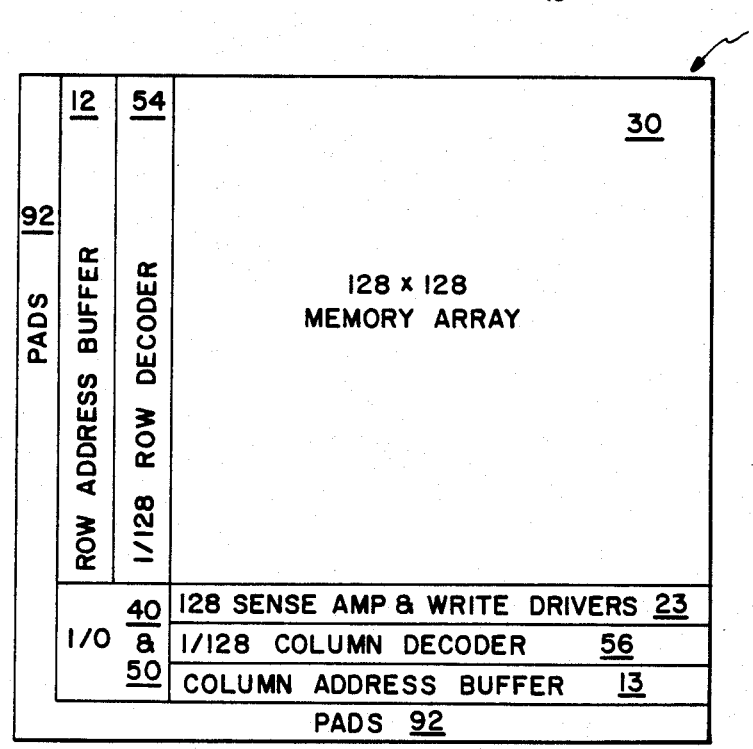
FIG. 8 is a floor plan of the integrated chip for a 16K×1.
Figure 9:
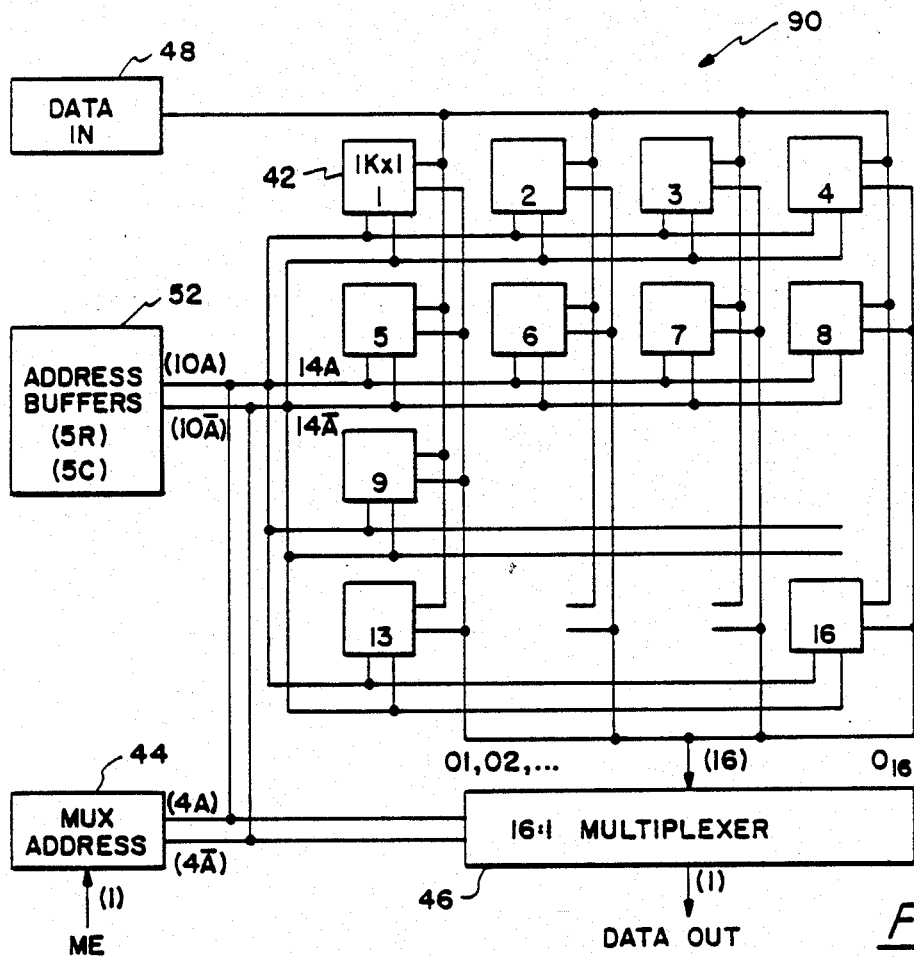
FIG. 9 shows the architecture for 1K×16 with an option for 16K×1.
Figure 10:
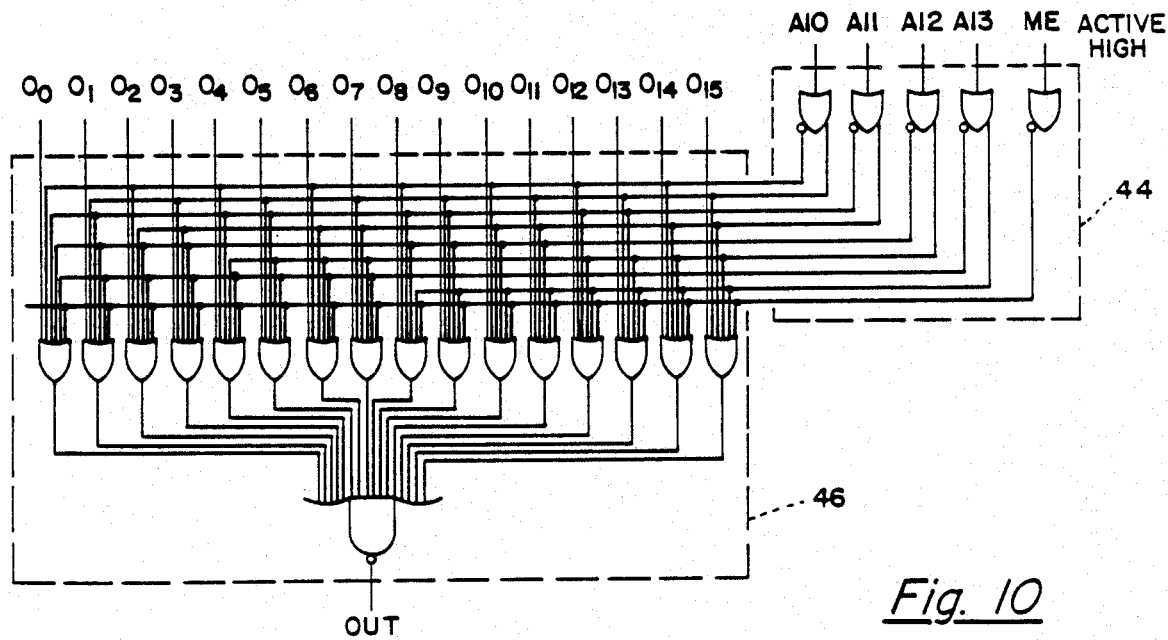
FIG. 10 is a logic diagram of the multiplexer used with the 1K×16 RAM.
Figure 11:
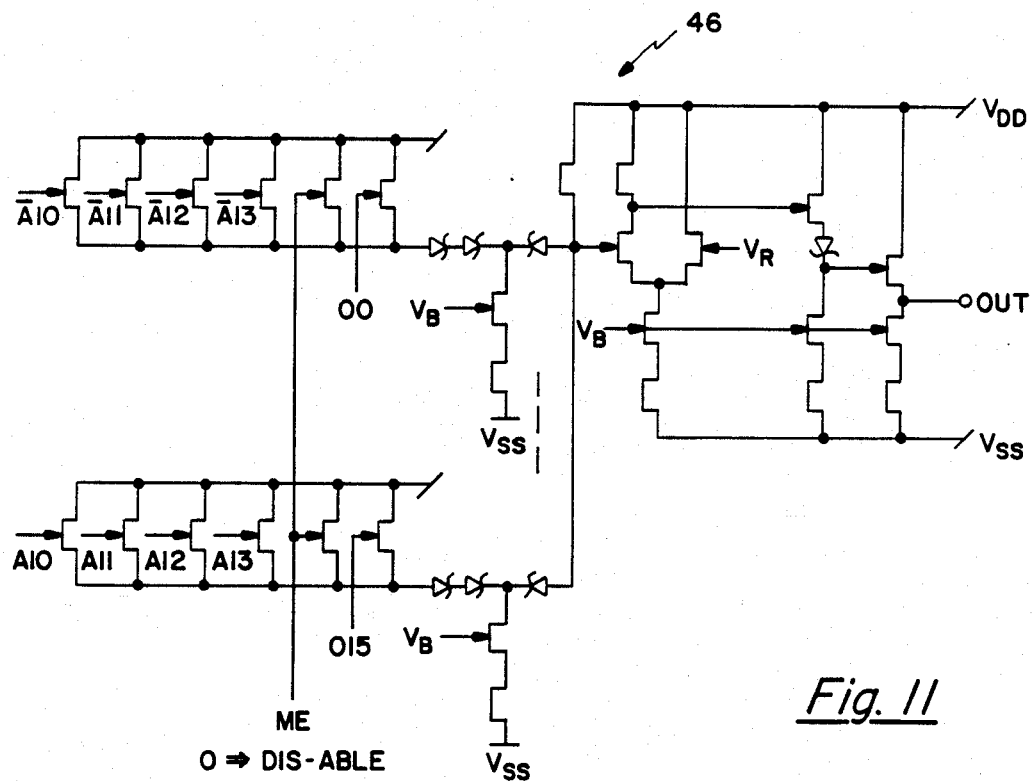
FIG. 11 is a schematic of the multiplexer circuitry.
Figure 12:
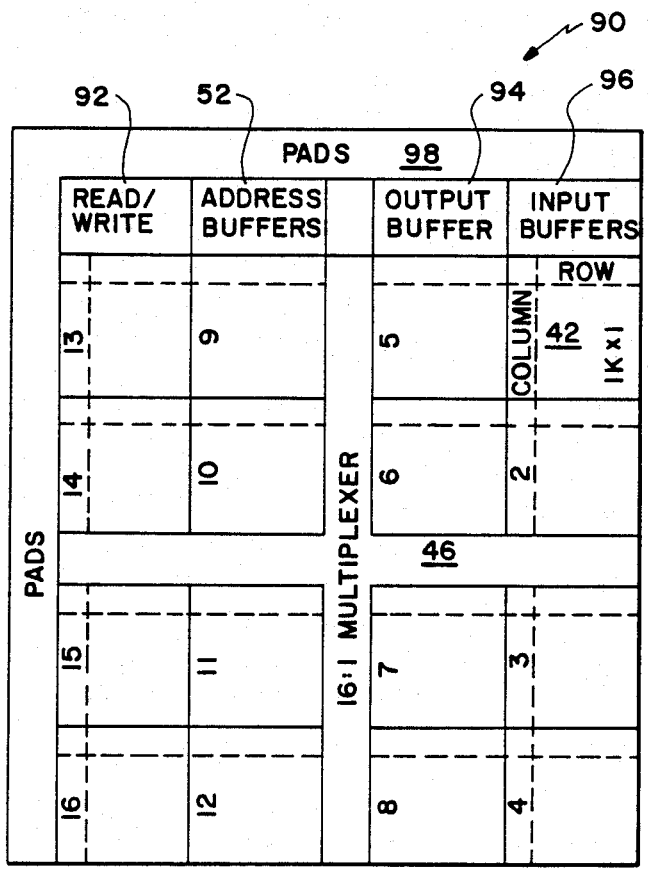
FIG. 12 is a floor plan of the integrated chip containing a 1K×16 RAM with an option for a 16K ×1 RAM.

FIG. 7 is a block diagram revealing the architecture of a 16K×1 RAM architecture. The address for the row of the memory cell to be selected comes into address buffer along lines A0–A6. The true plus complementary outputs of the address buffer 12 are input to the 1 to 128 row decoder 14. 128 outputs of the row decoder array 54 are input into a 128×128 memory array 30. Inputs A7–A13 are the address for selecting the column of the memory cell. These inputs go through address buffers 13. The true plus complementary outputs of address buffers 13 go on to a 1/128 column decoder 56. 128 outputs go on to the sense and write circuit 23 which consists of sense amplifier 22 and associated circuitry including FETs 84 and 86 and column decode switching FET 88. Circuit 23 ties in with the bit lines of memory cells 20 in the memory array 30. Write circuitry 50 is connected to the sense and write circuitry 23. The read circuitry incorporating part of circuit 23, namely the sense amplifier, is connected to data output buffer 26 which also makes up the read circuitry of RAM 10. FIG. 8 reveals the floor plan of the memory and associated circuitry on an integrated circuit chip. There are pads along the left and lower edges of the chip in FIG. 4 for external connection to the row address buffer 12, I/O circuitry 40 and 50, and column address buffer 13. Row decoder 54 is adjacent to row address buffer 12 to simplify interconnection of the two. Likewise, column decoder 56 is adjacent to column address buffer 13 as they are interconnected. Row decoder 54 abuts memory array 30 as it is directly connected to the word lines associated with various memory cells 20. 128 sense amplifiers and write drivers 23 abut 128 sense amplifiers and write drivers 23, memory array 30, and input/output circuitry 40 and 50, as these circuits are interconnected with one another. I/O 40 and 50 provide interface circuitry between the pads and 128 sense amplifiers and write drivers 23. FIG. 9 shows the architecture for a 1K ×16 RAM with an option of a 16K×1 RAM. Data is fed into the data-in circuitry 48 which is connected to each of 1K×1 modules 1–16. Address buffers 52 having complementary outputs are connected to the 16 1K×1 modules. One feature required only for the 1K ×16 architecture is a 16:1 multiplexer. Multiplexer address circuit 44 is connected to address buffers 52 and to 16 to 1 multiplexer 46 for outputting data from the respective 1K×1 memory modules 42. FIG. 10 is a logic diagram of multiplexer 46 and multiplexer address circuitry 44. FIG. 11 reveals the SCFL circuitry of multiplexer 46. FIG. 12 is the floor plan for the 1K×1 memory 90 with an option mode 16K ×1 memory. Pads 98 are for tying external connections to read-write circuitry 92, address buffers 52, output buffer 94, and input buffers 96. Output buffer 94 is connected to multiplexer 46. Read-write circuitry 92, address buffers 52, and input buffers are connected to each of the memory modules 42. Multiplexer 46 is also connected to address buffers 52 and input buffers 96.

Figure 13:
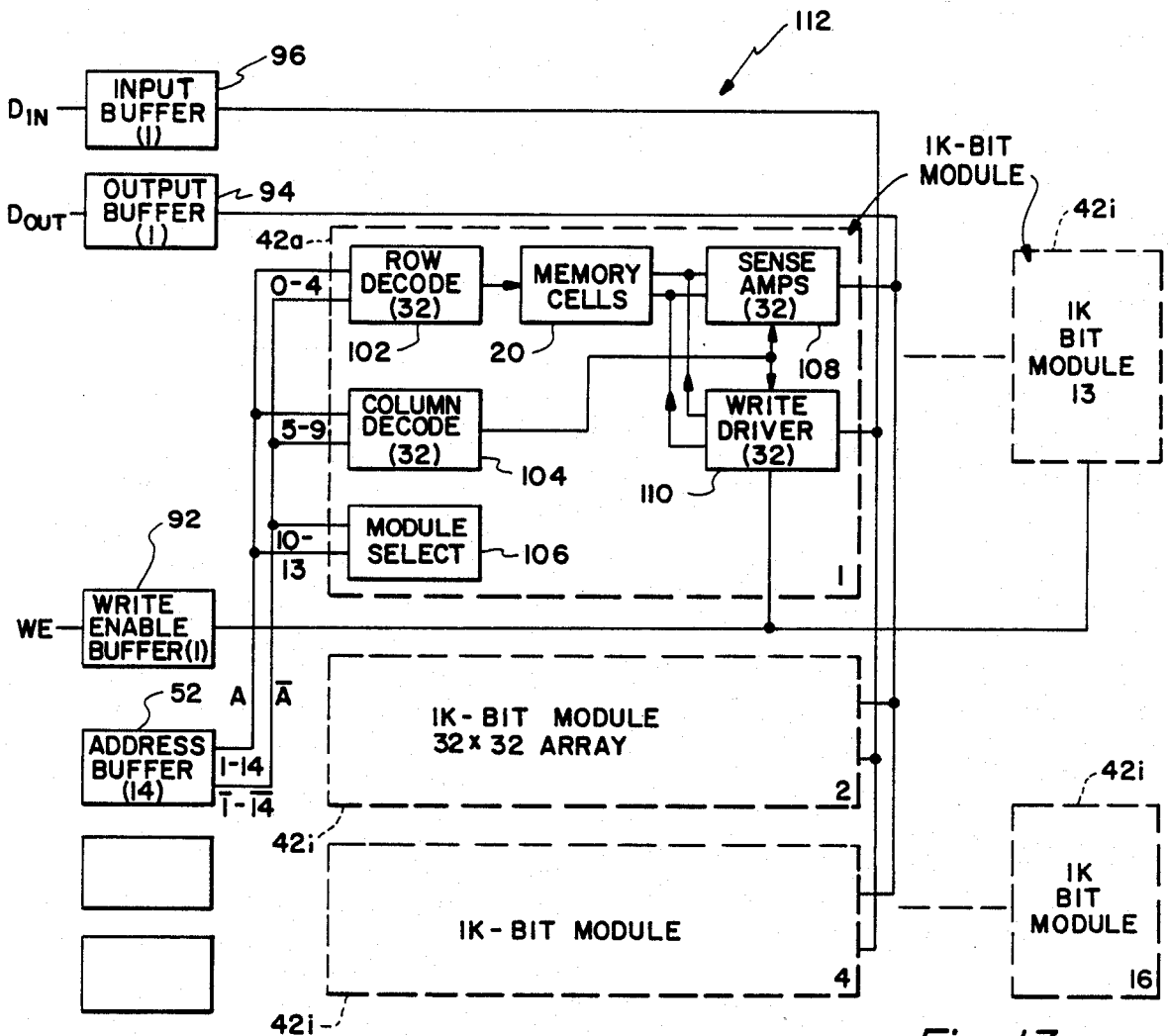
FIG. 13 is a block diagram of a power strobed modular 1K×16 RAM.

FIG. 13 is a block diagram of an alternative memory organization to lower the power consumption and improve the speed of the RAM. This organization divides the 16K memory into active and standby modules, in which only the active module is accessed. Accessing among active and inactive modules requires an addition of delay to power strobing of the inactive module resulting in an additional set-up time. FIG. 13 shows the 16K RAM divided into active and inactive modules, 42a and 42i, respectively consisting of 16×1K-bit modules 42. Each module 42 consist of 1024 RAM cells 20, 32 sense and column line circuits 104, 108 and 110, respectively, and power strobing circuitry 120 (in FIG. 14) to activate the read/write circuitry 92, 108 and 110. Power strobing does not affect the data stored in the 1K RAM bits. All 16K RAM cells 20 retain their data when the particular peripheral circuits 92, 108 and 110, are in active or standby mode. In FIG. 13, showing architecture 112 having active and inactive modules 42, one may note that one module 42a is activated and the remaining modules 42i are inactive. Input buffer 96 is connected to the write drivers 110 of modules 42. Output buffer 94 is connected to sense amplifiers 108 of modules 42. The write enabled buffer 92 is connected to write drivers 110 of modules 42. Address buffers 52 are connected to row decode circuitry 102, column decode circuitry 104 and module select circuitry 106. Bits 0-4 are for row decoding, 5-9 are for column decoding and 10-13 are for module selecting.

Figure 14:
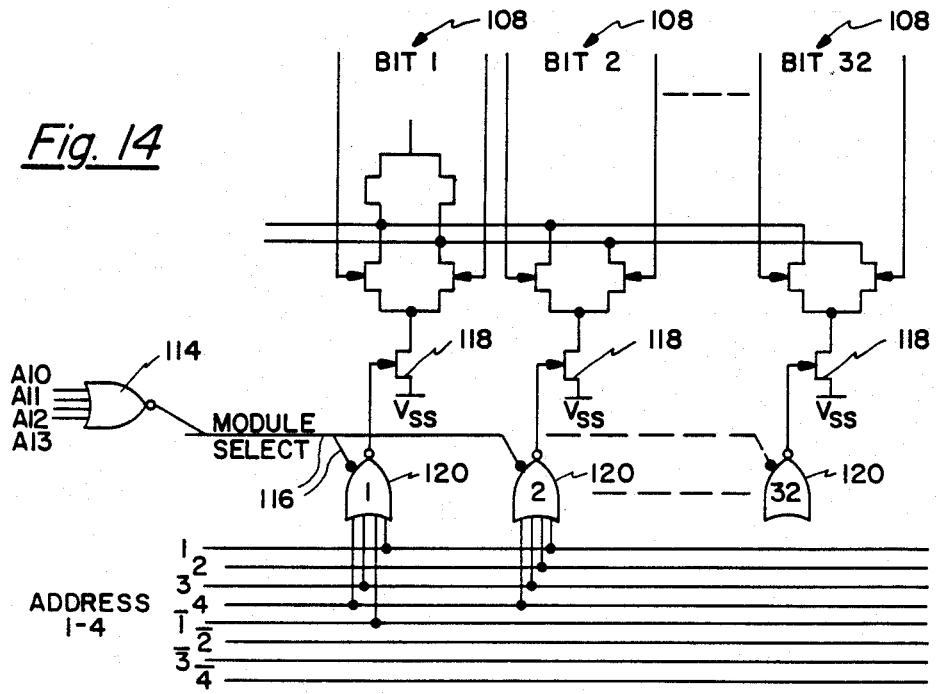
FIG. 14 is a schematic of power strobing circuitry.

Module select circuitry 106 of FIG. 13 is integral to active and inactive module determination; that is, the particular peripheral circuits are either in active or standby mode. The module select circuitry 106 is elaborated in FIG. 14. Gate 114 receives bits 10-13 for each unique address represented by lines 1-4 and their complements, and a unique bit is activated (i.e., moved from an inactive to an active mode). FIG. 14 shows an example of power strobing 32 NOR gates 120 to select the 32 sense amplifiers 108 of a 1K-bit module 42. This circuitry greatly reduces power since most of the modules 42 are in standby mode at one time.

We claim:

1. A GaAs SCFL RAM comprising:
   address buffer means for buffering input address signals;
   decoder means, means, connected to said address buffer means, for decoding buffered input address signals;
   a plurality of word lines connected to said decoder means, wherein the word lines are selectable by the address signals;
   a plurality of bit lines connected to said decoder means, wherein the bit lines are selectable by the address signals;
   data input buffer means, connected to said plurality of bit lines, for buffering input data signals;
   a plurality of memory cells connected to said plurality of word lines and to said plurality of bit lines, wherein certain memory cells are made accessible by selected word and bit lines;
   a plurality of sense amplifiers connected to said plurality of bit lines, wherein the sense amplifiers detect and indicate signal levels on the bit lines, and each sense amplifier comprises:
     a first FET having a gate connected to a bit line of said plurality of bit lines, having a drain and a source;
     a second FET having a gate connected to a bit line of said plurality of bit lines, having a source connected to the source of said first FET, and having a drain;
     a third FET having a gate connected to a fifth voltage, having a source connected to the drain of said first FET, and having a drain;
     a fourth FET having a gate connected to the fifth voltage, having a source connected to the drain of said second FET, and having a drain;
     a first load connected to the drain of said third FET and to a first voltage; and
     a second load connected to the drain of said fourth FET and to the first voltage; and
   buffer output means, connected to said plurality of sense amplifiers, for buffering output data signals from said plurality of sense amplifiers.

2. Apparatus of claim 1 further comprising:
   a fifth FET having a drain connected to the sources of said first and second FETs, having a gate connected to a third voltage, and having a source;
   a sixth FET having a source connected to the source of said fifth FET, having a drain connected to the gate of said first FET, and having a gate connected to said buffer input means;
   a seventh FET having a source connected to the source of said fifth FET, having a drain connected to the gate of said second FET, and having a gate connected to said buffer input means;
   an eighth FET having a drain connected to the sources of said fifth, sixth and seventh FETs, having a gate connected to said decoder means, and having a source;
   a third load connected to the source of said eighth FET and to a fourth voltage;
   a fourth load connected to the gate of said first FET and to said first voltage; and
   a fifth load connected to the gate of said second FET and to said first voltage.

3. Apparatus of claim 2 wherein said buffer output means comprises:
   a first FET having a gate connected to the drain of said third FET of said sense amplifier, a drain connected to said first voltage, and having a source;
   a second FET having a gate connected to the drain of said fourth FET of said sense amplifier, having a drain connected to said first voltage, and having a source;
   a first diode means, connected to the source of said first FET, for rectifying signals;
   a second diode means, connected to the source of said second FET, for rectifying signals;
   a fourth FET having a drain connected to said first diode means, having a gate connected to said third voltage, and having a source;
   a fifth FET having a drain connected to said second diode means, having a gate connected to the gate of said fourth FET, and having a source;
   a first load connected to the source of said fourth FET and to said fourth voltage;
   a second load connected to the source of said fifth FET and to said fourth voltage;
   a sixth FET having a gate connected to the drain of said fifth FET, and having a drain and a source;
   a seventh FET having a gate connected to the drain of said fourth FET, having a source connected to the source of said seventh FET, and having a drain;
   a third load connected to the drain of said sixth FET and to said first voltage;
   a fourth load connected to the drain of said seventh FET and to said first voltage;

an eighth FET having a drain connected to the sources of the sixth and seventh FETs, having a gate connected to the gate of said fifth FET, and having a source;

a fifth load connected to the drain of said eighth FET and to the fourth voltage;

a ninth FET having a source connected to the drain of said eighth FET, having a drain connected to the first voltage, and having a gate;

a tenth FET having a source connected to the drain of said eighth FET, having a drain connected to the first voltage, and having a gate;

an eleventh FET having a drain connected to the first voltage, having a gate connected to the drain of said sixth FET and having a source; and a twelfth FET having a drain connected to the source of said eleventh FET, having a gate connected to the drain of said seventh FET and having a source connected to the fourth voltage.

4. Apparatus of claim 3 wherein:
the gate of said ninth FET is an input for CS signals;
the gate of said tenth FET is an input for write enable (WE) signals; and
the drain of said twelfth FET is an output for data signals.

5. A GaAs SCFL RAM comprising:
address buffer means for buffering input address signals;
decoder means, connected to said address buffer means, for decoding buffered input address signals;
a plurality of word lines connected to said decoder means, wherein the word lines are selectable by the address signals;
a plurality of bit lines connected to said decoder means, wherein the bit lines are selectable by the address signals;
data input buffer means, connected to said plurality of bit lines, for buffering input data signals, wherein said data input buffer means has three level write circuitry comprising:
  a first FET having a drain connected to a first voltage, a gate connected to a second voltage source, and having a source;
  a second FET having a source connected to the source of said first FET, having a gate and a drain;
  a third FET having a drain connected to the source of said first FET, having a gate connected to a third voltage, and having a source;
  a first load connected to the source of said third FET and a fourth voltage;
  a fourth FET having a drain connected to the first voltage, having a gate connected to the drain of said second FET, and having a source;
  a fifth FET having a drain connected to a bit line of said plurality of bit lines, having a gate connected to the gate of said third FET, and having a source;
  first diode means, connected to the source of said fourth FET and to the drain of said fifth FET, for rectifying signals;
  a second load connected to the source of said fifth FET and to the fourth voltage;
  a sixth FET having a drain connected to the gate of said fourth FET, having a gate connected to the second voltage and having a source;
  a third load connected to the first voltage and to the drain of said sixth FET;
  a seventh FET having a drain connected to the source of said sixth FET, having a gate connected to the gate of said fifth FET and having a source;
  a fourth load connected to the source of said seventh FET and to the fourth voltage;
  an eighth FET having a drain connected to the first voltage, having a source connected to the drain of said seventh FET, and having a gate;
  a ninth FET having a source connected to the source of said eighth FET, having a drain and a gate;
  a fifth load connected to the first voltage and to the drain of said ninth FET;
  a tenth FET having a drain connected to the first voltage, having a gate connected to the drain
  an eleventh FET having a drain connected to a bit line of said plurality of bit lines, having a gate connected to the gate of said seventh FET, and having a source;
  second diode means, connected to the source of said tenth FET and to the drain of said fifth FET, for rectifying signals;
  a sixth load connected to the source of said eleventh FET and to the fourth voltage;
  a twelfth FET having a drain, connected to the gate of said tenth FET, having a gate and a source;
  a thirteenth FET having a drain connected to the first voltage, having a source connected to the source of said twelfth FET, and having a gate connected to said second voltage;
  a fourteenth FET having a drain connected to the source of said thirteenth FET, having a gate connected to the gate of said eleventh FET, and having a source; and
  a seventh load connected to the source of said fourteenth FET and to the fourth voltage; and
a plurality of memory cells connected to said plurality of word lines and to said plurality of bit lines, wherein certain memory cells are made accessible by selected word and bit lines;
a plurality of sense amplifiers connected to said plurality of bit lines, wherein sense amplifiers detect and indicate levels on the bit lines; and
buffer output means, connected to said plurality of sense amplifiers, for buffering output data signals from said plurality of sense amplifiers.

6. Apparatus of claim 5 wherein:
the gate of said second FET is an input for read/write select signals;
the gate of said eighth FET is an input for write enable signals;
the gate of said ninth FET is an input for data signals; and
the gate of said twelfth FET is an input for read/write select signals.

7. Apparatus of claim 6 wherein:
the second voltage connected to the gate of said third FET is an intermediate value between the value of the first voltage and the value of the fourth voltage.

8. A GaAs SCFL RAM comprising:
address buffer means for buffering input address signals;
decoder means, connected to said address buffer means, for for decoding buffered input address signals;

a plurality of word lines connected to said decoder means, wherein the word lines are selectable by the address signals;

a plurality of bit lines connected to said decoder means, wherein the bit lines are selectable by the address signals;

data input buffer means, connected to said plurality of bit lines, for buffering input data signals;

a plurality of memory cells connected to said plurality of word lines and to said plurality of bit lines, wherein certain memory cells are made accessible by selected word and bit lines, and each cell of said plurality of memory cells consists only:

a first FET having a source connected to a word line of said plurality of word lines, a drain and a gate;

a second FET having a source connected to the source of said first FET, a drain connected to the gate of said first FET, and a gate connected to the drain of said first FET;

a first diode connected to the drain of said first FET and connected to a line of said plurality of bit lines;

a second diode connected to the drain of said second FET and connected to said bit line of said plurality of bit lines;

a first load connected to the drain of said first FET and connected to a voltage source; and a second load connected to the drain of said second FET and connected to said voltage source;

a plurality of sense amplifiers connected to said plurality of bit lines, wherein the sense amplifiers detect and indicate signal levels on the bit lines, and bit lines, and each sense amplifier comprises:

a first FET having a gate connected to a bit line of said plurality of bit lines, having a drain and a source;

a second FET having a gate connected to a bit line of said plurality of bit lines, having a source connected to the source of said first FET, and having a drain;

a third FET having a gate connected to a fifth voltage, having a source connected to the drain of said first FET, and having a drain;

a fourth FET having a gate connected to the fifth voltage, having a source connected to the drain of said second FET, and having a drain;

a first load connected to the drain of said third FET and to a first voltage; and a second load connected to the drain of said fourth FET and to the first voltage; and buffer output means, connected to said plurality of sense amplifiers, for buffering output data signals from said plurality of sense amplifiers.

* * * * *

UNITED STATES PATENT AND TRADEMARK OFFICE
CERTIFICATE OF CORRECTION

PATENT NO. : 4,845,681

DATED : July 4, 1989

INVENTOR(S) : Tho T. Vu; Andrej Peczalski; James D. Joseph

It is certified that error appears in the above-identified patent and that said Letters Patent is hereby corrected as shown below:

Column 5, line 43, after "decoder", delete --means--.

Signed and Sealed this

Seventeenth Day of April, 1990

Attest:

HARRY F. MANBECK, JR.

*Attesting Officer*  *Commissioner of Patents and Trademarks*